United States Patent
He et al.

(10) Patent No.: US 12,178,038 B2
(45) Date of Patent: Dec. 24, 2024

(54) INTEGRATED ASSEMBLIES HAVING WORDLINE-DRIVER-CIRCUITRY DIRECTLY UNDER VERTICALLY-EXTENDING WORDLINES

(71) Applicant: Micron Technology, Inc., Boise, ID (US)

(72) Inventors: Yuan He, Boise, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 660 days.

(21) Appl. No.: 17/141,873

(22) Filed: Jan. 5, 2021

(65) Prior Publication Data

US 2022/0216219 A1    Jul. 7, 2022

(51) Int. Cl.
   *H10B 12/00*     (2023.01)
   *G11C 8/14*      (2006.01)
   *G11C 11/408*    (2006.01)
   *G11C 11/4091*   (2006.01)

(52) U.S. Cl.
   CPC .............. *H10B 12/50* (2023.02); *G11C 8/14* (2013.01); *G11C 11/4085* (2013.01); *G11C 11/4091* (2013.01); *H10B 12/30* (2023.02)

(58) Field of Classification Search
   CPC .... H10B 12/50; H10B 12/30; G11C 11/4085; G11C 11/4091; G11C 8/14
   See application file for complete search history.

(56) References Cited

U.S. PATENT DOCUMENTS

| | | | | |
|---|---|---|---|---|
| 2003/0095429 | A1* | 5/2003 | Hirose | G11C 7/18 257/E21.656 |
| 2012/0281465 | A1* | 11/2012 | Agan | G11C 11/1675 365/158 |
| 2015/0332751 | A1* | 11/2015 | Ting | G11C 5/025 365/230.03 |
| 2019/0164985 | A1* | 5/2019 | Lee | H01L 23/53295 |
| 2020/0279601 | A1* | 9/2020 | Kim | G11C 11/401 |
| 2022/0085182 | A1* | 3/2022 | Kataoka | H01L 29/22 |
| 2022/0278106 | A1* | 9/2022 | Kim | H01L 29/0649 |

OTHER PUBLICATIONS

Lee et al., U.S. Appl. No. 16/943,494, "Digit Line and Body Contact for Semiconductor Devices", filed Jul. 30, 2020, 87 pages.

* cited by examiner

*Primary Examiner* — David Vu
*Assistant Examiner* — Brandon C Fox
(74) *Attorney, Agent, or Firm* — Wells St. John P.S.

(57) ABSTRACT

Some embodiments include an integrated assembly having a CMOS-containing base containing wordline-driver-circuitry. The wordline-driver-circuitry is subdivided amongst horizontally-extending sub-wordline-driver (SWD) units. Memory cells are over the base, and are arranged in vertically-extending rows. Each of the memory cells includes an access device and a storage element coupled with the access device. Wordlines extend vertically along the rows. Each of the SWD units is associated with at least two of the wordlines and is configured to simultaneously activate the associated wordlines.

32 Claims, 7 Drawing Sheets

INTEGRATED ASSEMBLIES HAVING WORDLINE-DRIVER-CIRCUITRY DIRECTLY UNDER VERTICALLY-EXTENDING WORDLINES

TECHNICAL FIELD

Integrated assemblies. Integrated memory. Assemblies having wordline-driver-circuitry directly under vertically-extending wordlines.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or nonvolatile. Nonvolatile memory cells can store data for extended periods of time including when the computer is turned off. Volatile memory dissipates and therefore is rapidly refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Some memory cells may include a transistor in combination with a capacitor (or other suitable storage element). The transistor is utilized to selectively access the capacitor, and may be referred to as an access device. The capacitor may electrostatically store energy as an electric field within capacitor dielectric between two capacitor plates. The electrical state of the capacitor may be utilized to represent a memory state.

The wordlines may be coupled with wordline-driver-circuitry, and the digit lines may be coupled with sense-amplifier-circuitry. Memory devices (e.g., dynamic random-access memory, DRAM, devices) may be considered to collectively comprise the wordlines, digit lines, memory cells, sense-amplifier-circuitry and wordline-driver-circuitry. It is desired to achieve ever higher levels of integration, and accordingly it is desired to develop architectures which enable memory devices to consume smaller footprints of valuable semiconductor real estate.

DETAILED DESCRIPTION OF THE ILLUSTRATED EMBODIMENTS

Some embodiments include integrated assemblies which have vertically-extending wordlines, and which have wordline-driver-circuitry directly under at least some of the vertically-extending wordlines. Example embodiments are described with reference to FIGS. 1-9.

Figure 1:
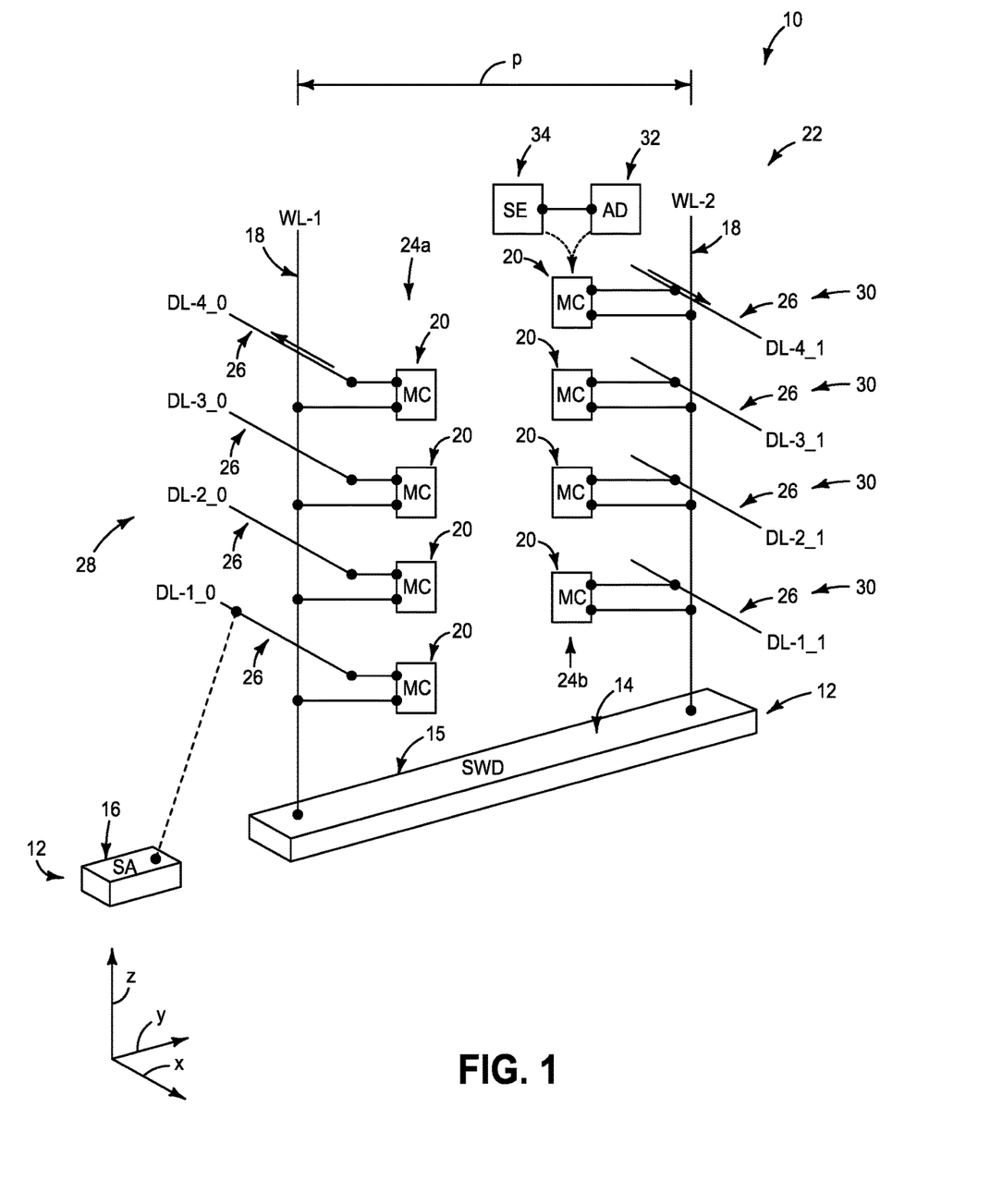
FIG. 1 is a diagrammatic three-dimensional view of an example region of an example integrated assembly.

Referring to FIG. 1, a region of an integrated assembly 10 is diagrammatically illustrated. An x, y, z coordinate system is provided adjacent to the region of the assembly 10 to assist in describing relative directions of various structures of the assembly 10.

The assembly 10 includes a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

The base 12 may include CMOS (complementary metal-oxide-semiconductor) regions which comprise sensing circuitry and/or control circuitry. In the illustrated embodiment, sub-wordline-driver (SWD) circuitry is within a region 14 of the base, and sense-amplifier-circuitry (SA) is within a region 16 of the base. The regions 14 and 16 may be referred to as an SWD region and an SA region, respectively. The illustrated SWD and SA regions may be representative of a large number of SWD and SA regions formed across the base 12.

A pair of vertically-extending wordlines 18 are shown over the base. The vertically-extending wordlines 18 extend along an illustrated z-axis. In some embodiments, the region 14 may be considered to extend along an illustrated y-axis direction, and to have a horizontally-extending upper surface 15. The wordlines 18 may be considered to extend orthogonally relative to the upper surface 15, or at least substantially orthogonally relative to such upper surface; with the term "substantially orthogonal" meaning orthogonal to within reasonable tolerances of fabrication and measurement. In some embodiments, the vertically-extending wordlines 18 may extend to within about 10° of orthogonal relative to the horizontally-extending upper surface 15 of the SWD region 14.

In the illustrated embodiment, the two illustrated wordlines 18 are labeled as WL-1 and WL-2 so that they may be distinguished relative to one another.

Memory cells (MC) 20 are adjacent to the wordlines 18. The memory cells may be considered to be arranged in an array 22, with such array including vertically-extending rows 24. In the shown embodiment, the row adjacent to the wordline WL-1 is labeled as 24a and the row adjacent to the wordline WL-2 is labeled as 24b. Each row comprises memory cells 20 which are vertically stacked one atop another. The wordlines 18 may be considered to extend along the rows 24 of the memory array 22, with each of the wordlines being associated with the memory cells of one of the rows (e.g., with the wordline WL-1 being associated with the memory cells 20 of the row 24a).

The memory cells 20 may comprise any suitable configuration, and in some embodiments may comprise an access device (AD) 32 coupled with a storage element (SE) 34, as shown relative to the top memory cell 20 of the row 24b. The access device 32 may be any suitable device, including, for example, a transistor, a diode, an ovonic threshold switch, etc. The storage element 34 may be any suitable device having at least two detectable states; and in some embodiments may be, for example, a capacitor, a resistive-memory device, a conductive-bridging device, a phase-change-memory (PCM) device, a programmable metallization cell (PMC), etc.

Digit lines 26 extend along columns of the memory array 22, with the illustrated digit lines being labeled DL-1_0, DL-1_1, etc.; where the labels on the digit lines indicate tier and digit line number (e.g., DL-1_0 is digit line 0 in tier 1). In the illustrated embodiment, the digit lines 26 extend orthogonally (or at least substantially orthogonally) relative to the horizontally-extending SWD region 14. Specifically, the digit lines 26 are shown to extend along an illustrated x-axis direction, and the SWD region 14 is shown to extend along an illustrated y-axis direction.

Each of the memory cells 20 is shown to be electrically coupled with one of the wordlines and one of the digit lines, and may be considered to be uniquely addressed by said one of the digit lines in combination with said one of the wordlines.

The digit lines are coupled with sense-amplifier-circuitry, and in the illustrated embodiment an example one of the digit lines (specifically, the digit line DL-1_0) is shown to be electrically coupled with the SA region 16. The other digit lines would also be coupled to SA regions, but such SA regions are not illustrated in order to simplify the drawing. A couple of example physical directions from the digit lines to the SA regions associated with digit lines are diagrammatically indicated with arrows along the digit lines DL-4_0 and DL-4_1.

The SWD region 14 is directly under the wordlines 18, and is shown to be electrically coupled to such wordlines. In some embodiments, the SWD region 14 may be considered to correspond to an SWD unit, with such unit being associated with the two wordlines WL-1 and it WL-2, and being configured to simultaneously activate such wordlines. Although the illustrated SWD unit 14 is configured to simultaneously activate two wordlines, in other embodiments comparable SWD units may be utilized for simultaneously activating more than two wordlines. Generally, the SWD units may be configured to simultaneously activate at least two of the wordlines 18, at least four of the wordlines 18, etc. The SWD region 14 may comprise any suitable circuitry, and in some embodiments may comprise one or more inverters. Utilization of inverters may enable the packing density of the SWD regions to be increased as compared to other configurations lacking the inverters.

The SA region 16 is shown to be laterally offset from the SWD region 14, and to not be directly under the memory cells 20. In some embodiments, the SA region 16 may be laterally offset from the array 22 so that it is not directly under such array. In other embodiments, at least a portion of the SA region 16 may be under the array 22. The SA region 16 may be provided in any suitable location, including under the array 22, laterally offset relative to the array 22, over the array 22, etc.

The illustrated region of the assembly 10 may be considered to be a portion 28 of the assembly along a pair of the wordlines. Such portion may be representative of a large number of portions within the memory array 22. The memory array may comprise hundreds, thousands, hundreds of thousands, millions, etc., of memory cells; hundreds, thousands, hundreds of thousands, millions, etc., of wordlines; and hundreds, thousands, hundreds of thousands, millions, etc., of digit lines. The SWD unit may be representative of a large number of SWD units provided within the base 12, with the SWD units together being comprised by an overall configuration of the wordline-driver-circuitry.

The portion 28 may be considered to comprise levels (tiers) 30 which each include a pair of the illustrated digit lines and a pair of the illustrated memory cells (for instance, the bottom tier 30 includes the digit lines DL-1_0 and DL-1_1, and includes the bottom memory cells 20 within the rows 24a and 24b). Although the illustrated region comprises four of the tiers 30, it is to be understood that there may be any suitable number of the tiers. For instance, in some embodiments there may be eight of the tiers, 16 of the tiers, 32 of the tiers, 64 of the tiers, etc.

An advantage of the configuration of FIG. 1 may be that the formation of the SWD region 14 directly under the vertically-extending wordlines 18 enables the SWD region to be tightly packed relative to the memory array 22, and enables valuable semiconductor real estate to be conserved relative to conventional configurations. It may be advantageous for the SWD region 14 to be configured to simultaneously activate two or more wordlines in that SWD regions would generally be relatively large as compared to the wordline pitch (with an example wordline pitch being diagrammatically shown in FIG. 1 as a pitch P). Thus, the minimum footprint of individual wordline-and-SWD-configurations is limited by the footprint of the SWD regions. Having wordlines in one-to-one correspondence with the SWD regions would limit the pitch of the wordlines to the pitch of the SWD regions. In contrast, having multiple wordlines associated with each of the SWD regions allows the pitch of the wordlines to be reduced to less than the pitch of the SWD regions.

Figure 2:
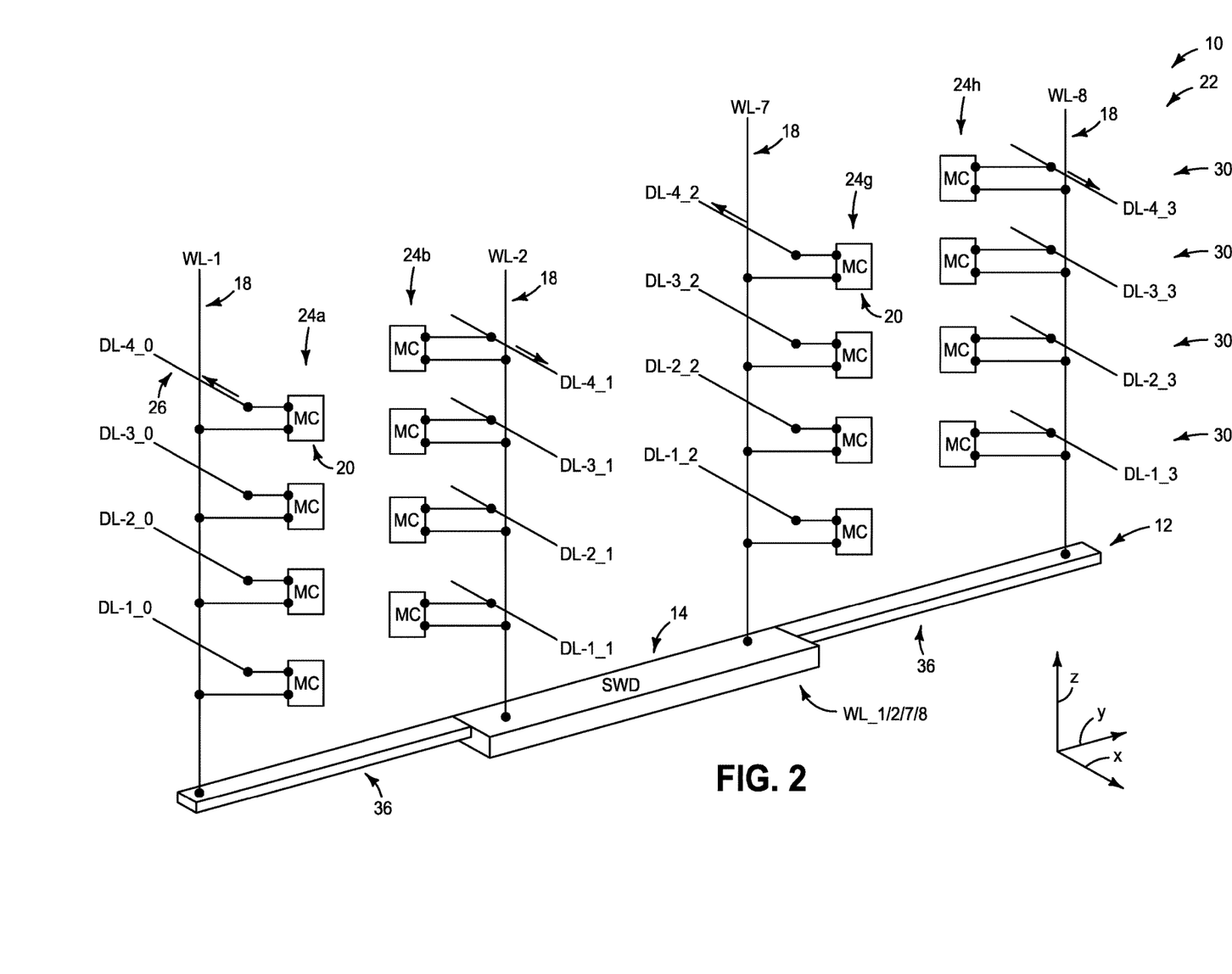
FIG. 2 is a diagrammatic three-dimensional view of an example region of an example integrated assembly.

FIG. 2 shows an example region of another example integrated assembly 10. The example region of FIG. 2 includes an SWD region (unit) 14 along a base 12, and includes four wordlines 18 associated with such SWD region. The wordlines are labeled as WL-1, WL-2, WL-7 and WL-8. Each of the wordlines is associated with a row 24 of the memory cells 20 within the array 22, with the individual rows being labeled 24a, 24b, 24g and 24h.

Digit lines 26 extend along columns of the array 22. Each of the memory cells 20 is uniquely addressed by one of the digit lines in combination with one of the wordlines. A few example physical directions from the digit lines to the SA regions associated with digit lines are diagrammatically indicated with arrows along the digit lines DL-4_0, DL-4_1, DL-4_2 and DL-4_3.

The illustrated region includes four of the tiers 30. In other embodiments, the region may comprise more than four of such tiers, and may, for example, comprise eight of the tiers, 16 of the tiers, 32 of the tiers, 64 of the tiers, etc.

The SWD unit 14 may be configured to simultaneously activate all four of the illustrated wordlines 18, and thus is labeled as WL_1/2/7/8. In some embodiments, the SWD unit 14 may be provided to extend to a sufficient length such that all of the wordlines are directly over the SWD region. In the shown embodiment, the SWD region 14 (e.g., the CMOS-containing region) is only directly under the central wordlines WL-2 and WL-7, and redistribution circuitry (e.g., wiring) 36 is provided to couple the SWD region 14 with the outer two wordlines WL-1 and WL-8.

The memory arrays 22 of the embodiments of FIGS. 1 and 2 may comprise any suitable configurations. An example configuration is described with reference to FIGS. 3 and 4.

Figure 3:
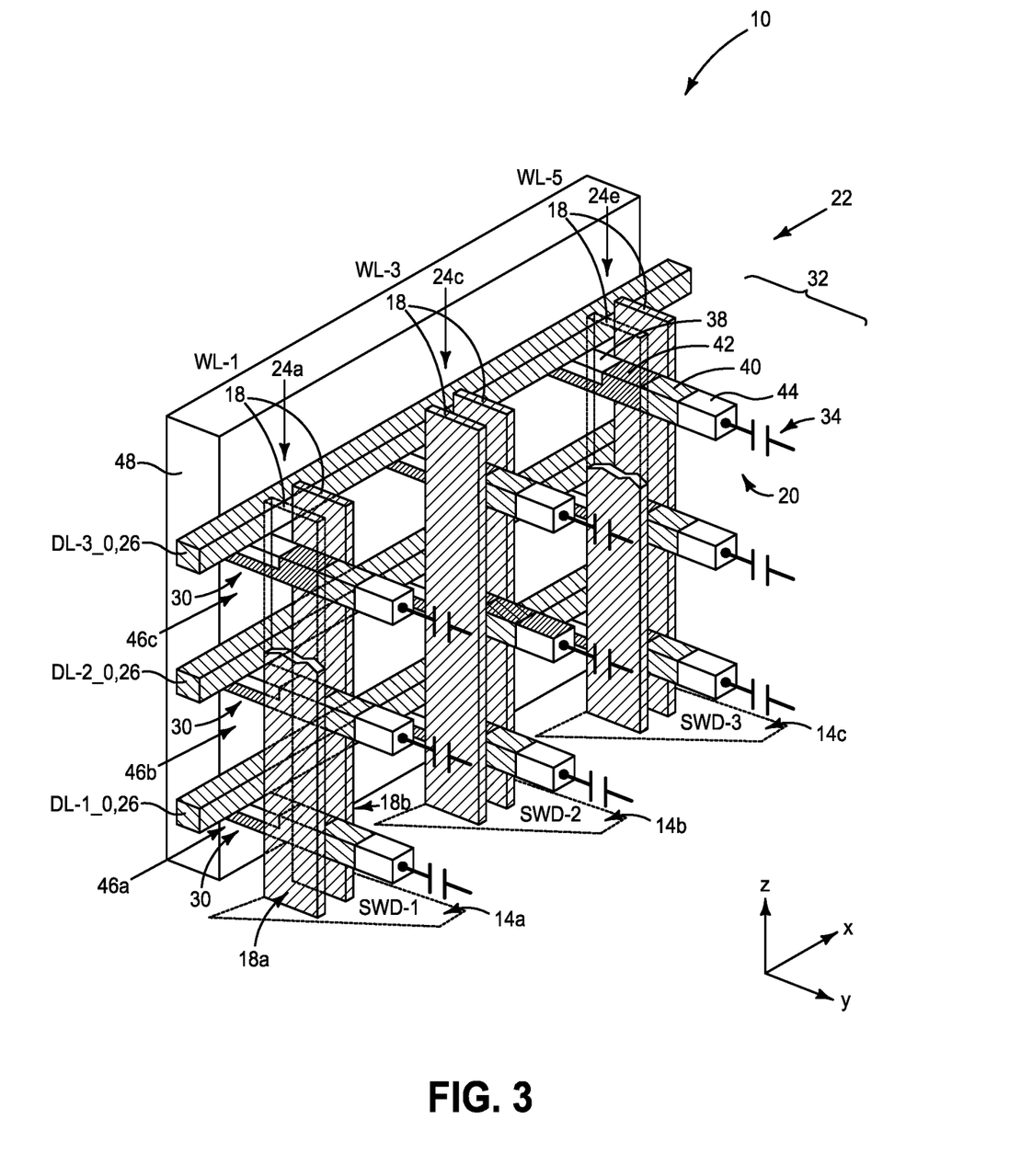
FIG. 3 is a diagrammatic three-dimensional view of an example region of an example integrated assembly.

Referring to FIG. 3, the access devices 32 are shown to correspond to transistors (only one of which is labeled), with such transistors including source/drain regions 38 and 40, and channel regions 42. The storage elements 34 correspond to capacitors (only one of which is labeled), with such capacitors being coupled to the transistors 32 through conductive interconnects 44. In some embodiments, the conductive interconnects may be considered to be part of the capacitors 34, and may, for example, be considered to be part of the storage nodes of such capacitors.

Memory cells 20 (only one of which is labeled) comprise the transistors 32 and the capacitors 34. The memory cells are arranged within the array 22, with such array having the rows 24 extending along an illustrated z-axis direction, and having columns 46 extending along an illustrated x-axis direction. The individual rows are labeled as 24a, 24c and 24e, and the individual columns are labeled as 46a-c.

Digit lines 26 (labeled DL-1_0, DL-2_0 and DL-3_0) extend along the columns 46, and are coupled with the source/drain regions 38 of the transistors 32.

Wordlines 18 (labeled WL-1, WL-3 and WL-5) extend along the rows of the memory array, and are adjacent to the channel regions 42 of the transistors 32. In the illustrated embodiment, each of the wordlines comprises two components (labeled 18a and 18b for the wordline WL-1), with such components extending along the z-axis direction and being on opposing sides of the channel regions 42. In some embodiments, each of the wordlines may be considered to be bifurcated into two vertically-extending components. In other embodiments, the wordlines may comprise other suitable configurations, and may, for example, comprise only a single component on one side of a channel region, may comprise gate-all-around configurations, etc.

The wordlines 18 comprise gating regions operatively adjacent to the channel regions 42 of the transistors 32 so that the source/drain regions 38 and 40 of the individual transistors 32 are gatedly coupled to one another. When the term "gated coupling" is utilized herein, such may refer to the controlled coupling/decoupling of the source/drain regions 38 and 42 from one another that may be induced by electrical activation/deactivation the wordlines 18.

The gating regions along the wordlines 18 may be spaced from the channel regions 42 by gate dielectric material (not shown). The gate dielectric material may comprise any suitable composition(s), and in some embodiments may comprise, consist essentially of, or consist of silicon dioxide.

The wordlines extend to SWD units 14, and in the illustrated embodiment each of the wordlines extends to a separate SWD unit (with the SWD units being labeled 14a-c, as well as being labeled SWD-1 through SWD-3). In some embodiments, the assembly 10 of FIG. 3 may be considered to comprise wordline-driver-circuitry, with such wordline-driver-circuitry being subdivided amongst multiple SWD units. The illustrated units 14a-c are representative of the SWD units.

In the illustrated embodiment, body regions (channel regions) 42 of the transistors 32 are coupled with a conductive plate 48. Such plate may be utilized to enable excess carriers (e.g., holes) to drain from the body regions 42 during some operational modes of the memory cells 20. The plate 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 4:
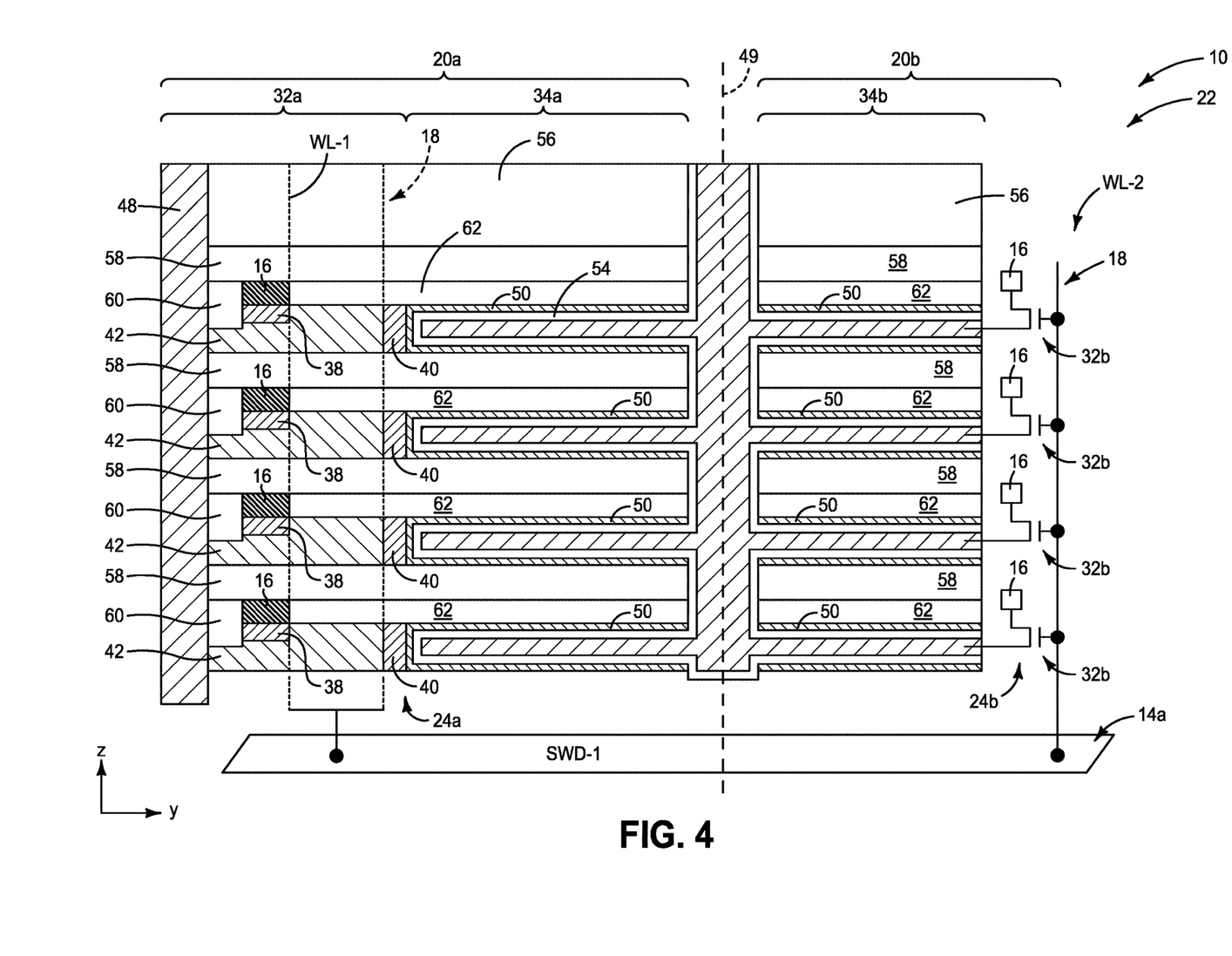
FIG. 4 is a diagrammatic cross-sectional side view of an example region of an example integrated assembly.

FIG. 4 shows a cross-sectional side view of the assembly 10 of FIG. 3 along the y-axis direction, with the cross-sectional view being through the memory cells 20 associated with the wordline WL-1. The wordline WL-1 is shown in dashed-line (phantom) view in FIG. 4 to indicate that it is offset from the illustrated cross-section. Specifically, the wordline WL-1 would be in and out of the page relative to the illustrated cross-section of FIG. 4.

The transistors 32 are shown to extend horizontally along the y-axis direction, and are shown to comprise the body regions 42, and the source/drain regions 38 and 40.

The capacitors 34 are also shown to extend horizontally along the y-axis direction, and are shown to comprise outer nodes (storage nodes) 50, inner nodes (a plate electrode) 52, and capacitor dielectric material 54.

The nodes 50 and 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The nodes 50 and 52 may comprise the same composition as one another, or may comprise different compositions relative to one another.

The capacitor dielectric material 54 may comprise any suitable composition(s), and in some embodiments may comprise one or more of silicon dioxide, aluminum oxide, hafnium oxide, etc.

The SWD region 14a is shown to extend horizontally along the y-axis direction, and to be electrically coupled with both the wordline WL-1 and a wordline WL-2. The wordline WL-2 is shown to be associated with a row 24b of the memory cells 20. In the illustrate embodiment, the memory cells associated with the row 24b are labeled as 20b and the memory cells associated with the row 24a are labeled as 20a. Also, the capacitors and transistors within the memory cells 20a are labeled as 34a and 32a, respectively; and the capacitors and transistors within the memory cells 20b are labeled as 34b and 32b, respectively.

The capacitors 34b are mirror images of the capacitors 34a across a plane 49 centrally located between the capacitors 34a and 34b. The plane 49 extends through the plate electrode 52.

The capacitors 34a and 34b extend horizontally along the y-axis. The transistors 32a also extend horizontally along the y-axis. The transistors 32b may be configured analogously to the transistors 32a so that they also extend horizontally along the y-axis. In the illustrated embodiment, the transistors 32b are shown schematically in order to simplify the drawing.

In some embodiments, the memory cells 20a within the row 24a may be considered to be in paired relationships with the memory cells 20b within the row 24b, in that the memory cells 20a and 20b share the capacitor plate 52 within the capacitors 34a and 34b.

In some embodiments, the wordlines WL-1 and WL-2 may be considered to be paired with one another, as they are associated with the paired rows 24a and 24b. The wordlines WL-1 and WL-2 may be considered together to form a set of paired wordlines, and such set may be representative of a large number of sets of paired wordlines extending across the memory array 22 of the integrated assembly 10. In the illustrated embodiment, at least portions of the individual memory cells 20a and 20b are laterally between the wordlines WL-1 and WL-2 (e.g., the capacitors 34a and 34b are laterally between the wordlines WL-1 and WL-2).

The wordlines WL-1 and WL-2 extend to the same SWD region 14a, and may be simultaneously activated by the SWD region 14a.

FIG. 4 shows numerous insulative materials 56, 58, 60 and 62 within the assembly 10. Such insulative materials may comprise any suitable composition(s), including, for example, one or more of silicon nitride, aluminum oxide, silicon dioxide, hafnium oxide, zirconium oxide, etc. The insulative materials 56, 58, 60 and 62 may be compositionally different from one another, or one or more of such insulative materials may be compositionally the same as one another.

Figure 5:
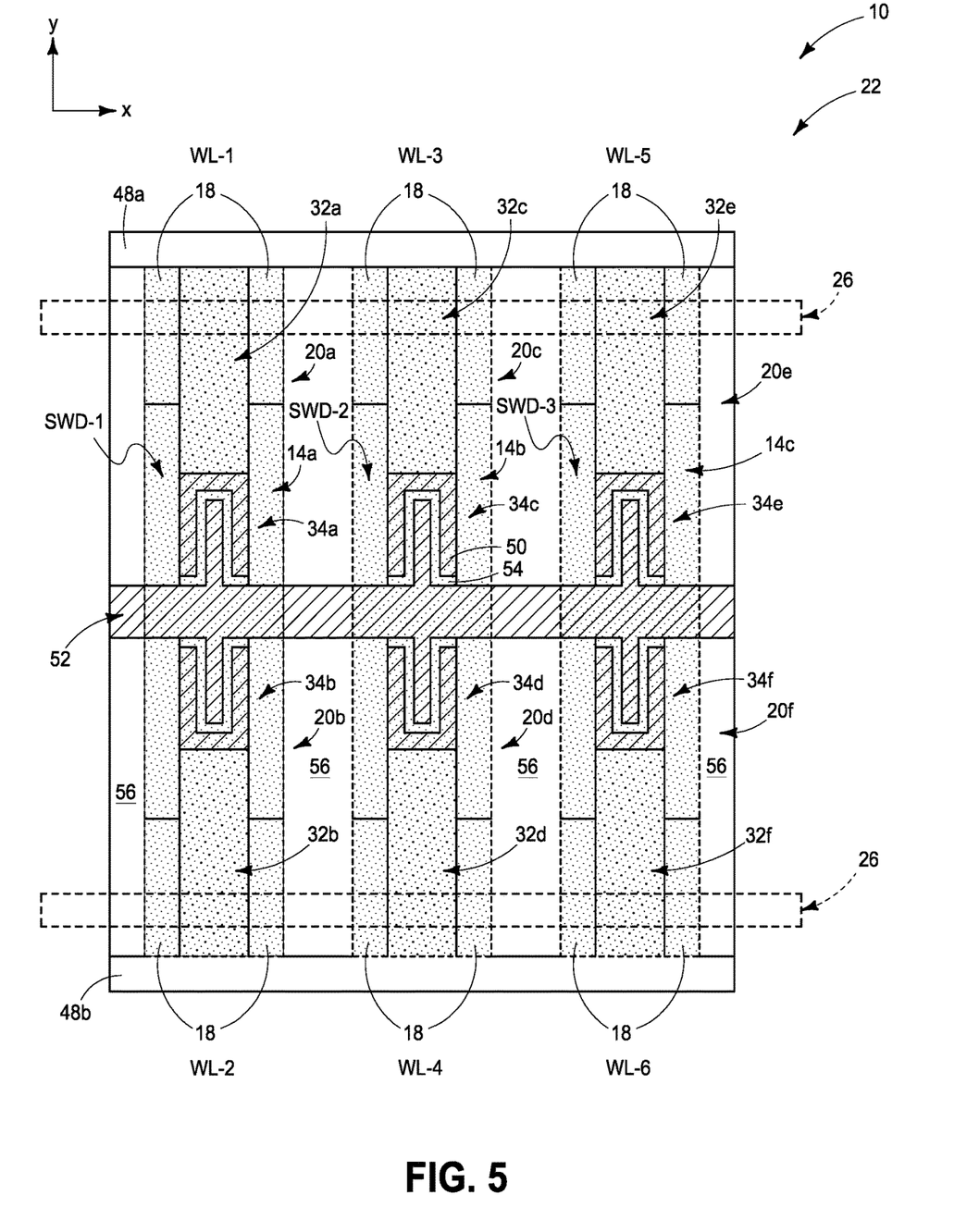
FIG. 5 is a diagrammatic cross-sectional top-down view of an example region of an example integrated assembly.

FIG. 5 shows a top-down sectional view through a region of the assembly 10 in a configuration similar to that of FIGS. 3 and 4. The assembly includes six representative wordlines 18 (labeled WL-1 through WL-6). A pair of representative digit lines 26 are diagrammatically illustrated in dashed-line (phantom) view to indicate that the digit lines are out of the plane relative to the illustrated cross-sectional view.

The memory array 22 of FIG. 5 is shown to comprise representative memory cells 20a-f, with each of the memory cells including a horizontally-extending transistor (e.g., 32a) and a horizontally-extending capacitor (e.g., 34a). The plate electrode 52 bifurcates the memory cells into a first set on one side of the plate electrode, and a second set on the other side of the plate electrode. The first set includes the memory cells 20a, 20c and 20e, and the second set includes the memory cells 20b, 20d and 20f.

The memory cells 20a and 20b may be considered to be in paired relation relative to one another. Similarly, the memory cells 20c and 20d may be considered to be in paired relation relative to one another, and the memory cells 20e and 20f may be considered to be in paired relation relative to one another.

The wordlines WL-1 and WL-2 may be considered to be a first paired set of wordlines associated with a first SWD unit 14a (SWD-1), the wordlines WL-3 and WL-4 may be considered to be a second paired set of wordlines associated with a second SWD unit 14b (SWD-2), and the wordlines WL-5 and WL-6 may be considered to be a third paired set of wordlines associated with a third SWD unit 14c (SWD-3).

A first conductive plate 48a is operatively proximate the body regions (channel regions) of the transistors 32a, 32c and 32e to drain excess carrier from such body regions during operational modes of the memory cells 20a, 20c and 20e. Similarly, a second conductive plate 48b is operatively proximate the body regions of the transistors 32b, 32d and 32f to drain excess carrier from such body regions during operational modes of the memory cells 20b, 20d and 20f.

The embodiment of FIG. 5 shows each of the SWD regions 14 to be associated with two of the wordlines (e.g., the SWD region 14a is associated with the wordlines WL-1 and WL-2). In other embodiments, analogous SWD regions may be associated with more than two wordlines. For instance, FIG. 6 shows an embodiment in which individual SWD regions are associated with four wordlines.

Figure 6:
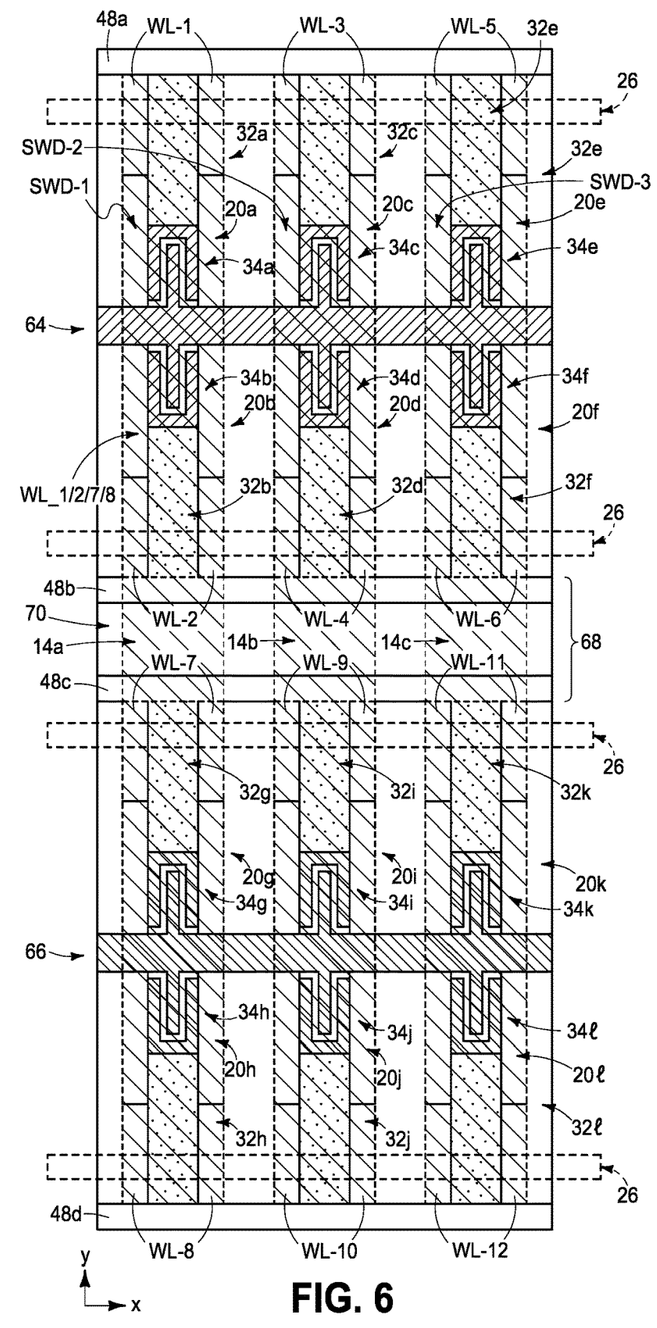
FIG. 6 is a diagrammatic cross-sectional top-down view of an example region of an example integrated assembly.

The integrated assembly 10 of FIG. 6 includes twelve representative wordlines WL-1 through WL-12, and includes representative memory cells 20a through 20l operatively adjacent gating regions of the wordlines. The integrated assembly 10 of FIG. 6 also includes the SWD regions 14a-c (SWD-1 through SWD-3). However, unlike the assembly of FIG. 5, the assembly of FIG. 6 has each of the individual SWD regions associated with four of the wordlines. For instance, the SWD region 14a (SWD-1) is associated with the wordlines WL-1, WL-2, WL-7 and WL-8, and is configured to simultaneously activate all of such associated wordlines.

FIG. 6 shows conductive plates 48a-d extending along the x-axis direction, and operatively coupled with body regions of transistors 32a-1 of the memory cells 20a-1 to drain excess carrier from such body regions.

The wordlines WL-1 through WL-12 may be considered to comprise six paired sets of wordlines, with such paired sets including WL-1/WL-2, WL-3/WL-4, WL-5/WL-6, the WL-7/WL-8, WL-9/WL-10 and WL-11/WL-12. The paired sets may be considered to be within a first grouping 64 and a second grouping 66, with the second grouping being laterally offset relative to the first grouping. For instance, the paired set WL-1/WL-2 is within the first grouping 64, and is laterally offset from the paired set WL-7/WL-8 which is within the second grouping 66. However, the paired sets WL-1/WL-2 and WL-7/WL-8 are both associated with the same SWD unit (specifically, the unit 14a, SWD-1).

An intervening region 68 is between the two groupings 64 and 66. The intervening region includes an insulative panel 70, with such insulative panel being sandwiched between the conductive plates 48b and 48c. In some embodiments, the plates 48b and 48c may be referred to as first and second conductive plates, respectively, and the insulative panel 70 may be considered to be sandwiched between such first and second conductive plates.

The insulative panel 70 may comprise any suitable composition(s), and in some embodiments may comprise one or more of silicon dioxide, silicon nitride, aluminum oxide, hafnium oxide, etc.

Figure 7:
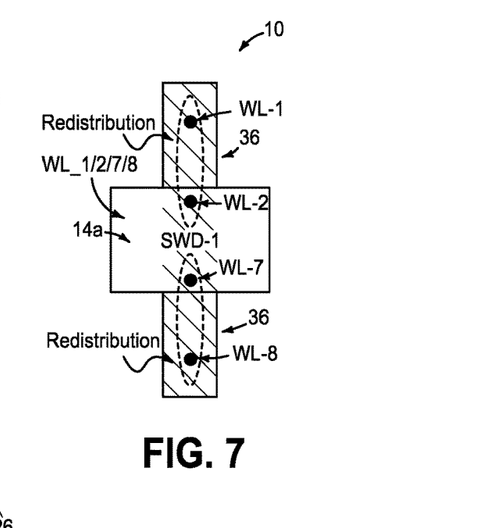
FIG. 7 is a diagrammatic top-down view of an example region of an example integrated assembly.

The SWD units 14a-c may extend horizontally along a sufficient length to be under all of the wordlines associated with such SWD units in the configuration of FIG. 6. For instance, the SWD unit 14a (SWD-1) may extend horizontally along a sufficient length to be under all of the wordlines WL-1, WL-2, WL-7 and WL-8. Alternatively, the SWD units may be under only a couple of the wordlines associated with such SWD units, and redistribution circuitry may be provided to reach the other wordlines, analogous to the configuration described above with reference to FIG. 2. FIG. 7 shows a specific embodiment which may be utilized relative to the configuration of FIG. 6. Specifically, FIG. 7 diagrammatically illustrates the paired wordline sets WL-1/WL-2 and WL-7/WL-8 associated with the SWD unit 14a (SWD-1), and shows the SWD unit 14a to be only directly under the central wordlines WL-2 and WL-7. Redistribution circuitry 36 is provided to reach from the SWD unit 14a to the outer wordlines WL-1 and WL-8.

Figure 8:
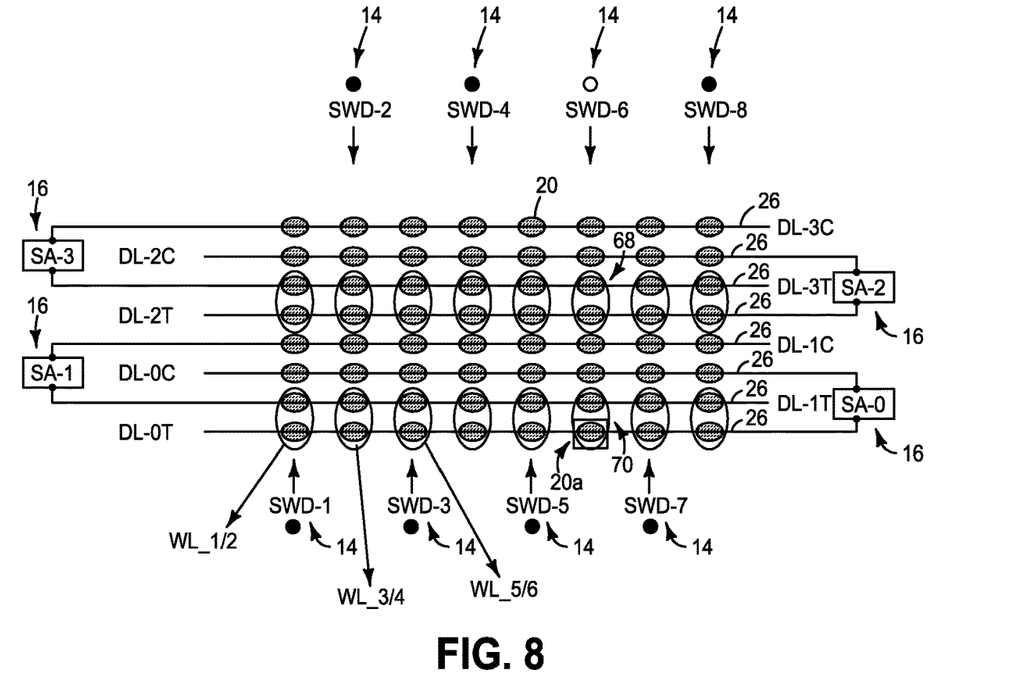
FIGS. 8 and 9 are diagrammatic illustrations showing example operational relationships of example memory devices.
Figure 9:
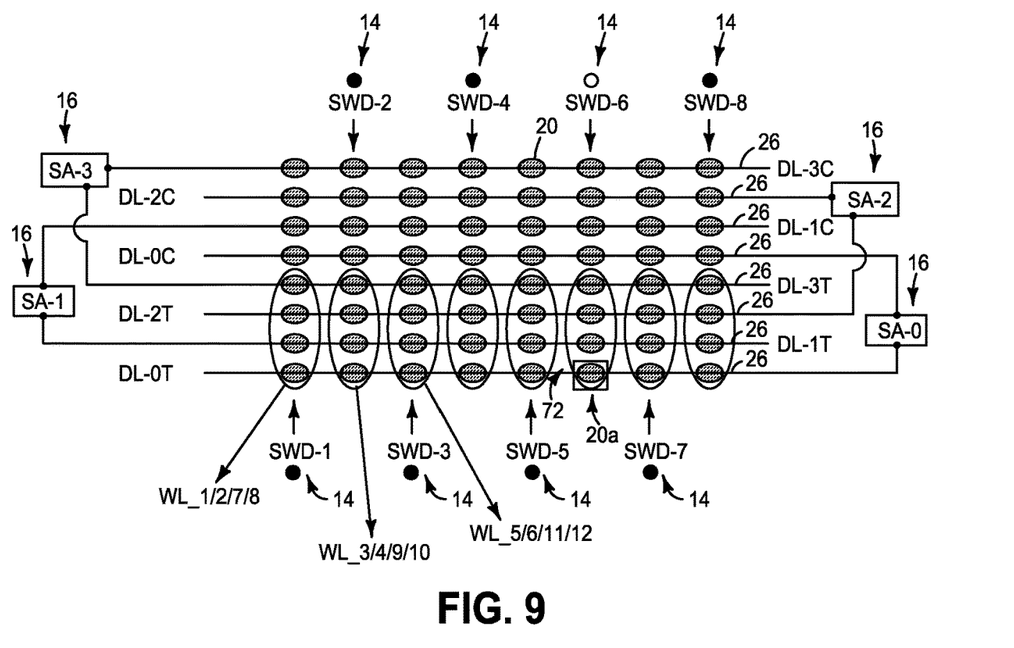

The configurations described above may be operated in any suitable manner. FIGS. 8 and 9 illustrate example operational mechanisms that may be employed relative to such configurations.

Referring first to FIG. 8, such shows an operational mechanism that may be utilized relative to the example embodiments of FIGS. 1 and 5 in which SWD units are associated with only two wordlines. It is to be understood that the representation of FIG. 8 is not a physical representation of a particular embodiment, but rather is utilized for representing operational characteristics relative to the example embodiments described above. Accordingly, the structures shown in FIG. 8 may or may not have physical proximity represented within the figure. The wordlines are not specifically shown in FIG. 8, but rather memory cells 20 are diagrammatically illustrated with ellipsis, and the locations of the wordlines may be inferred relative to the locations of the memory cells.

The SWD units 14 are diagrammatically indicated by arrows corresponding to SWD-1 through SWD-8. An open circle is provided next to SWD-6 to indicate that such is selected, and closed circles (black dots) are provided next to the other SWDs to indicate that such are not selected.

The memory cells 20 are arranged within columns along representative digit lines 26. The memory cells 20 are also arranged along rows which extend along directions pointed to by arrows under the SWD units. The rows and columns of FIG. 8 are not the same as the rows 24 and columns 46 described above relative to the memory arrays 22 (e.g., the memory array 22 shown in FIG. 3).

The digit lines are shown to be arranged in pairs of comparatively coupled lines, with the comparatively coupled lines extending to sense amplifiers 16. For instance, the digit lines DL-OT and DL-OC correspond to a pair of comparatively coupled digit lines which extend to the sense amplifier circuitry SA-0. The digit line DL-OT may be considered to be a "true" digit line and the digit line DL-OC may be considered to be a "complementary" digit line which is comparatively coupled with the true digit line. For purposes of understanding this disclosure and the claims that follow, a first digit-line is "comparatively coupled" with a second digit-line through sense-amplifier-circuitry if the sense-amplifier-circuitry is configured to compare electrical properties (e.g., voltage) of the first and second digit-lines with one another. The terms "true" and "complementary" are arbitrary, and are used to differentiate the digit-lines which are compared to one another through sense-amplifier-circuitry. The tiers of the memory cells are not indicated in FIG. 8, only the digit line numbers, for convenience in illustrating particular concepts.

The true digit lines may be laterally offset relative to the complementary digit lines. If the digit lines of FIGS. 1 and 5 are the true digit lines, the associated complementary digit lines may be in a different array relative to the array 22 shown in FIGS. 1 and 5.

Each of the SWD units may be considered to simultaneously activate multiple wordlines. For instance, SWD-6 is shown to activate two sets 68 and 70 of the memory cells 20, with such sets being diagrammatically illustrated utilizing ellipses. Each of the sets 68 and 70 includes two memory cells. The sets 68 and 70 may be within different tiers relative to one another. A particular memory cell within the activated sets may be addressed utilizing one of the indicated digit lines. In the shown embodiment, a memory cell 20a is shown to be addressed utilizing SWD-6 and the digit line DL-OT. The addressing of the memory cell is diagrammatically indicated by providing a square box around the memory cell.

FIG. 9 shows an operational mechanism that may be utilized relative to the example embodiments of FIGS. 2, 6 and 7, in which SWD units are associated with four wordlines. The SWD unit identified as SWD-6 is shown to activate a set 72 comprising four of the memory cells 20. The memory cell 20a within such activated set is addressed utilizing the digit line identified as DL-OT.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having vertically-extending wordlines over a base. Memory cells are adjacent to the wordlines. Each of the wordlines is associated with a row of the memory cells. The memory cells of each row are vertically stacked one atop another. Wordline-driver-circuitry is within the base. The wordline-driver-circuitry is subdivided amongst sub-wordline-driver (SWD) units. Each of the SWD units is associated with at least two of the wordlines and is configured to simultaneously activate said at least two of the wordlines.

Some embodiments include an integrated assembly having a CMOS-containing base containing wordline-driver-circuitry. The wordline-driver-circuitry is subdivided amongst horizontally-extending sub-wordline-driver (SWD) units. Memory cells are over the base, and are arranged in vertically-extending rows. Each of the memory cells includes an access device and a storage element coupled with the access device. Wordlines extend vertically along the rows. Each of the SWD units is associated with at least two of the wordlines and is configured to simultaneously activate the associated wordlines.

Some embodiments include an integrated assembly comprising an array of stacked memory cells over a CMOS-containing base. Each of the memory cells includes a horizontally-extending capacitor coupled with a horizontally-extending access device. The memory cells are arranged in vertically-extending rows. The rows are in paired relationships where paired rows share a capacitor plate between the horizontally-extending capacitors of the memory cells. The CMOS-containing base comprises wordline-driver-circuitry. The wordline-driver-circuitry is subdivided amongst sub-wordline-driver (SWD) units. Wordlines extend along the rows. The wordlines are in paired relationships where a set of the paired wordlines is associated with each of the paired rows. Each of the SWD units is associated with at least one of the sets of the paired wordlines and is configured to simultaneously activate the wordlines of said at least one of the sets.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
vertically-extending wordlines over a base;
memory cells adjacent the wordlines, each of the wordlines being associated with a row of the memory cells; the memory cells of each row being vertically stacked one atop another; and
wordline-driver-circuitry within the base; the wordline-driver-circuitry being subdivided amongst sub-wordline-driver (SWD) units; each of the SWD units being associated with at least two of the wordlines and being configured to simultaneously activate said at least two of the wordlines; the base comprising one or more of sensing circuitry and redistribution circuitry.

2. The integrated assembly of claim 1 wherein each of the SWD units is directly under at least some of the wordlines associated therewith.

3. The integrated assembly of claim 1 wherein each of the SWD units is directly under all of the wordlines associated therewith.

4. The integrated assembly of claim 1 wherein each of the SWD units is configured to simultaneously activate at least four of the wordlines.

5. The integrated assembly of claim 4 wherein each of the SWD units is configured to simultaneously activate four of the wordlines; wherein the four wordlines simultaneously activated by an SWD unit are considered to be associated with such SWD unit; wherein each of the SWD units includes CMOS circuitry under a central two of the four wordlines associated therewith and includes redistribution circuitry extending from the CMOS circuitry to the outer two of the four wordlines associated therewith.

6. The integrated assembly of claim 1 comprising horizontally-extending digit lines extending along columns of the memory cells.

7. The integrated assembly of claim 6 wherein the digit lines extend to sense-amplifier-circuitry within the base and laterally offset from being directly under the memory cells.

8. The integrated assembly of claim 1 wherein the base comprises monocrystalline silicon.

9. The integrated assembly of claim 1 wherein each of the memory cells includes a transistor coupled with a capacitor.

10. The integrated assembly of claim 9 wherein the transistors extend horizontally.

11. The integrated assembly of claim 9 wherein the capacitors extend horizontally.

12. An integrated assembly, comprising:
a CMOS-containing base; the CMOS-containing base comprising wordline-driver-circuitry; the wordline-driver-circuitry being subdivided amongst horizontally-extending sub-wordline-driver (SWD) units;
memory cells over the base, the memory cells being arranged in vertically-extending rows; each of the memory cells including an access device and a storage element coupled with the access device;
wordlines extending vertically along the rows;
each of the SWD units being associated with at least two of the wordlines and being configured to simultaneously activate said at least two of the wordlines; and
wherein each of the SWD units is associated with only two of the wordlines.

13. The integrated assembly of claim 12 comprising horizontally-extending digit lines extending along columns of the memory cells.

14. The integrated assembly of claim 13 wherein the horizontally-extending digit lines extend substantially orthogonally relative to the horizontally-extending SWD units.

15. The integrated assembly of claim 12 wherein the base has a horizontally-extending surface, and wherein the wordlines extend substantially orthogonally relative to the horizontally-extending surface.

16. The integrated assembly of claim 12 wherein each of the SWD units is associated with four of the wordlines.

17. The integrated assembly of claim 12 wherein the access devices are transistors.

18. The integrated assembly of claim 17 wherein the transistors extend horizontally.

19. The integrated assembly of claim 12 wherein the storage elements are capacitors.

20. The integrated assembly of claim 19 wherein the capacitors extend horizontally.

21. The integrated assembly of claim 12 wherein the SWD units include inverters.

22. An integrated assembly, comprising:
an array of stacked memory cells over a CMOS-containing base;

each of the memory cells including a horizontally-extending capacitor coupled with a horizontally-extending access device; the memory cells being arranged in vertically-extending rows; the rows being in paired relationships where paired rows share a capacitor plate between the horizontally-extending capacitors of the memory cells;
- the CMOS-containing base comprising wordline-driver-circuitry; the wordline-driver-circuitry being subdivided amongst sub-wordline-driver (SWD) units;
- wordlines extending along the rows; the wordlines being in paired relationships where a set of the paired wordlines is associated with each of the paired rows; and
- each of the SWD units being associated with at least one of the sets of the paired wordlines and being configured to simultaneously activate the wordlines of said at least one of the sets; and
- wherein each of the SWD units is associated with only one of the sets of the paired wordlines.

23. The integrated assembly of claim 22 wherein the access devices are transistors.

24. The integrated assembly of claim 22 comprising horizontally-extending digit lines extending along columns of the memory cells.

25. The integrated assembly of claim 24 wherein the horizontally-extending capacitors and access devices extend along a first direction, and wherein the horizontally-extending digit lines extend along a second direction substantially orthogonal to the first direction.

26. The integrated assembly of claim 22 wherein at least portions of the individual memory cells within the paired rows associated with a given of the sets of the paired wordlines are laterally between the paired wordlines of said given of the sets.

27. The integrated assembly of claim 22 wherein each of the SWD units is associated with at least two of the sets of the paired wordlines and is configured to simultaneously activate the paired wordlines of said at least two of the sets.

28. The integrated assembly of claim 22 wherein each of the SWD units is associated with two of the sets of the paired wordlines and is configured to simultaneously activate the paired wordlines of said two of the sets, and wherein the two of the sets are laterally offset from one another and are spaced from one another by an intervening region which includes an insulative panel.

29. The integrated assembly of claim 28 wherein the intervening region includes the insulative panel sandwiched between a first conductive plate and a second conductive plate.

30. The integrated assembly of claim 28 wherein the intervening region includes the insulative panel sandwiched between a first semiconductor-containing plate and a second semiconductor-containing plate.

31. An integrated assembly, comprising:

vertically-extending wordlines over a base;

memory cells adjacent the wordlines, each of the wordlines being associated with a row of the memory cells; the memory cells of each row being vertically stacked one atop another;

wordline-driver-circuitry within the base; the wordline-driver-circuitry being subdivided amongst sub-wordline-driver (SWD) units; each of the SWD units being associated with at least two of the wordlines and being configured to simultaneously activate said at least two of the wordlines;

wherein each of the SWD units is configured to simultaneously activate at least four of the wordlines; and wherein each of the SWD units is configured to simultaneously activate four of the wordlines; wherein the four wordlines simultaneously activated by an SWD unit are considered to be associated with such SWD unit; wherein each of the SWD units includes CMOS circuitry under a central two of the four wordlines associated therewith and includes redistribution circuitry extending from the CMOS circuitry to the outer two of the four wordlines associated therewith.

32. An integrated assembly, comprising:

vertically-extending wordlines over a base;

memory cells adjacent the wordlines, each of the wordlines being associated with a row of the memory cells; the memory cells of each row being vertically stacked one atop another;

wordline-driver-circuitry within the base; the wordline-driver-circuitry being subdivided amongst sub-wordline-driver (SWD) units; each of the SWD units being associated with at least two of the wordlines and being configured to simultaneously activate said at least two of the wordlines;

horizontally-extending digit lines extending along columns of the memory cell; and wherein the digit lines extend to sense-amplifier-circuitry within the base and laterally offset from being directly under the memory cells.

* * * * *